United States Patent
Gan et al.

(10) Patent No.: US 12,424,565 B2
(45) Date of Patent: Sep. 23, 2025

(54) RADIATION PROTECTION FOR SEMICONDUCTOR DEVICES AND ASSOCIATED SYSTEMS AND METHODS

(71) Applicant: Micron Technology, Inc., Boise, ID (US)

(72) Inventors: Chong Leong Gan, Taichung (TW); Min Hua Chung, Taichung (TW); Yung Sheng Zou, Taichung (TW); Lu Fu Lin, Taichung (TW); Li Jao, Taichung (TW)

(73) Assignee: Micron Technology, Inc., Boise, ID (US)

( * ) Notice: Subject to any disclaimer, the term of this patent is extended or adjusted under 35 U.S.C. 154(b) by 549 days.

(21) Appl. No.: 17/718,140

(22) Filed: Apr. 11, 2022

(65) Prior Publication Data

US 2023/0062160 A1    Mar. 2, 2023

Related U.S. Application Data

(60) Provisional application No. 63/238,361, filed on Aug. 30, 2021.

(51) Int. Cl.
| | |
|---|---|
| *H01L 23/552* | (2006.01) |
| *H01L 23/06* | (2006.01) |
| *H01L 25/065* | (2023.01) |
| *H05K 9/00* | (2006.01) |

(52) U.S. Cl.
CPC ............ *H01L 23/552* (2013.01); *H01L 23/06* (2013.01); *H01L 25/0657* (2013.01); *H05K 9/0081* (2013.01)

(58) Field of Classification Search
CPC . H01L 23/06; H01L 25/0657; H01L 23/3135; H01L 23/3128; H01L 25/18; H01L 2225/06506; H01L 2225/0651; H01L 23/552–556; H05K 9/0081
See application file for complete search history.

(56) References Cited

U.S. PATENT DOCUMENTS

| | | | |
|---|---|---|---|
| 6,064,555 | A | 5/2000 | Czajkowski et al. |
| 6,239,479 | B1 | 5/2001 | Hwang et al. |
| 6,285,079 | B1 | 9/2001 | Kunikiyo |
| 2015/0069588 | A1 | 3/2015 | Kang et al. |
| 2015/0348915 | A1 | 12/2015 | Maillard et al. |

OTHER PUBLICATIONS

International Application No. PCT/US2022/038044—International Search Report and Written Opinion, dated Nov. 16, 2022, 9 pages.

*Primary Examiner* — Cuong B Nguyen
(74) *Attorney, Agent, or Firm* — Dorsey & Whitney LLP

(57) ABSTRACT

Semiconductor devices and associated systems and methods are disclosed herein. In some embodiments, the semiconductor devices include a package substrate, a stack of dies carried by the package substrate, and one or more radiation shields configured to absorb neutrons from neutron radiation incident on the semiconductor device. The radiation shields can include one or more walls attached to a perimeter portion of the package substrate at least partially surrounding the stack of dies and/or a lid carried over the stack of dies. Each of the radiation shields can include hydrocarbon materials, boron, lithium, gadolinium, cadmium, and like materials that effectively absorb neutrons from neutron radiation. In some embodiments, the semiconductor devices also include a molding material over the stack of dies and the radiation shields, and a hydrocarbon coating over an external surface of the mold material.

18 Claims, 11 Drawing Sheets

RADIATION PROTECTION FOR SEMICONDUCTOR DEVICES AND ASSOCIATED SYSTEMS AND METHODS

CROSS-REFERENCE TO RELATED APPLICATION(S)

The present application claims priority to U.S. Provisional Patent Application No. 63/238,361, filed Aug. 30, 2021, the disclosure of which is incorporated herein by reference in its entirety.

TECHNICAL FIELD

The present disclosure is generally related to systems and methods for stacked semiconductor devices. In particular, the present technology relates to stacked semiconductor devices having radiation shielding materials for protecting the electrical components of semiconductor devices.

BACKGROUND

Microelectronic devices, such as memory devices, microprocessors, and other electronics, typically include one or more semiconductor dies mounted to a substrate and encased in a protective covering. The semiconductor dies include functional features, such as memory cells, processor circuits, interconnecting circuitry, etc. Semiconductor die manufacturers are under continuous pressure to reduce the volume occupied by semiconductor devices while increasing the capacity and/or speed of the resulting semiconductor assemblies. To meet these demands, semiconductor die manufacturers often stack multiple semiconductor dies vertically on top of each other to increase the capacity and/or the performance of semiconductor devices within the limited area on a circuit board or other element to which the semiconductor devices and/or assemblies are mounted. The stacked dies are then electrically coupled to the circuit board and can send and receive signals individually or in conjunction. However, as the components of the semiconductor devices shrink, they become more susceptible to damage from various sources.

Figure 1:
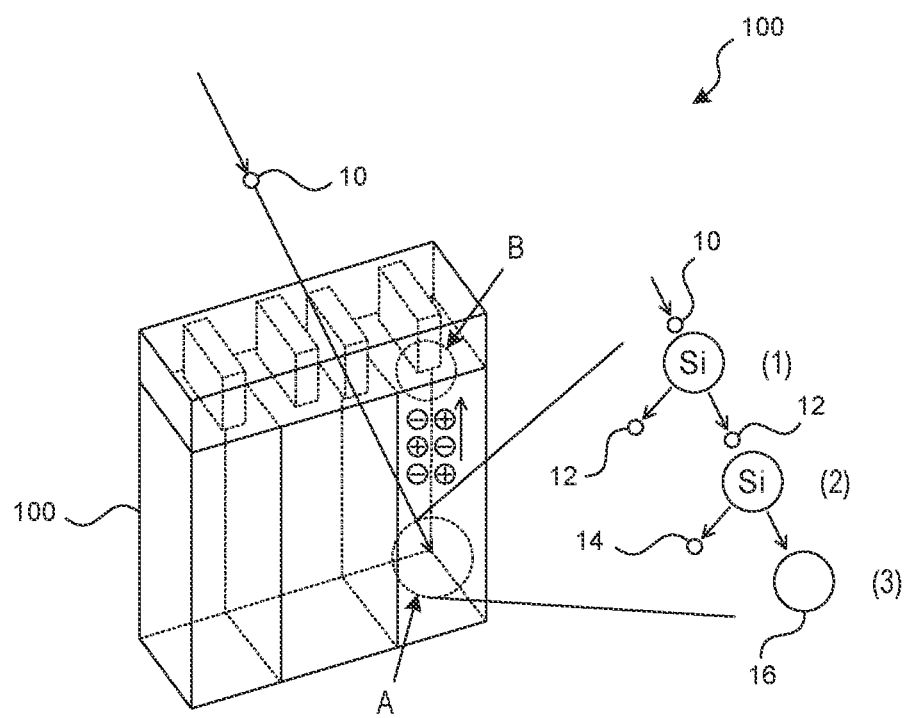
FIG. 1 is a schematic diagram of the effects of neutron radiation on a semiconductor device.

The drawings have not necessarily been drawn to scale. Similarly, some components and/or operations can be separated into different blocks or combined into a single block for the purpose of discussion of some of the implementations of the present technology. Moreover, while the technology is amenable to various modifications and alternative forms, specific implementations have been shown by way of example in the drawings and are described in detail below. The intention, however, is not to limit the technology to the particular implementations described.

DETAILED DESCRIPTION

Overview

Semiconductor devices are typically manufactured in a first location, then eventually incorporated into electrical devices in a second location. Between the first location, the manufactured semiconductor devices are subject to a range of possible stresses that can undermine their eventual performance. For example, various mechanical and/or environmental factors (e.g., blunt impacts, transportation temperatures, and the like) can cause minor amounts of damage to the manufactured semiconductor devices, eventually impacting their electrical performance. Accordingly, the electrical performance of the manufactured semiconductor devices is often tested both after the manufacturing process (to ensure a set of semiconductor devices meet the performance standard when shipped) and before being incorporated into an electronic device (to ensure the set of semiconductor devices was not overly damaged between locations). As the size of semiconductor devices has continued to shrink, the divergence between the two tests has continued to grow.

The inventors have realized that exposure to cosmic radiation, especially secondary cosmic radiation particles, is one source of the performance reduction between the two locations. Further, without wishing to be bound by theory, it is believed that as the size of semiconductor devices and their components continues to shrink, the performance reductions caused by damage from cosmic radiation will continue to grow. Further, it is believed that the impact of cosmic radiation on the performance of semiconductor devices increases with longer storage and/or transportation times between the first location and the second location, as well as over the lifetime of any given semiconductor device after being integrated into an electronic device.

More specifically, the inventors have realized that high energy neutrons that result from cosmic rays interacting with the atmosphere (e.g., sometimes referred to as secondary cosmic radiation) can have a significant impact on the performance of semiconductor devices. FIG. 1 is a schematic diagram illustrating some of the effects of the secondary cosmic radiation on a semiconductor device 100. As illustrated, the secondary cosmic radiation includes one or more high energy neutrons 10 that are constantly incident the semiconductor device 100. Over time, the high energy neutrons 10 impact structures in the semiconductor device 100, causing a spallation therein. An enlarged diagram of the spallation is shown for the region A, beginning at step 1 with an impact between one of the high energy neutrons 10 and a silicon atom in the semiconductor device 100. The impact one or more causes nucleon 12 to be emitted from the silicon atom. The loss of the nucleon causes the nucleus of the silicon molecule to be excited and unstable at step 2. At step 3, the excited nucleus decomposes into an emitted particle 14 (e.g., deuterium and/or tritium), a residual particle 16 (e.g., a magnesium atom, aluminum atom, sodium atom, etc.), and one or more charged particles 18. Returning to the general illustration of FIG. 1, the charged particles emitted during the decomposition can funnel through the semiconductor device, causing a strong of captures and releases of oppositely charged particles that eventually cause an error in region B (e.g., at a P-N junction in the semiconductor device 100). In some cases, the error is an electrical interference with the functioning of the semiconductor device 100 (e.g., degrading signals through the semiconductor device 100). In some cases, the spallation causes permanent damage to the physical structures within the semiconductor device 100, which can eventually reduce the performance of the semiconductor device 100.

Semiconductor devices that include features directed to absorbing neutrons in the neutron radiation discussed above, as well as associated systems and methods, are disclosed herein. In some embodiments, the semiconductor devices include a package substrate, a stack of one or more semiconductor dies (the "die stack") carried by the package substrate, and one or more radiation shields (sometimes referred herein to as sacrificial structures and/or neutron absorbing structures) configured to completely absorb and/or absorb impacts from the neutrons that result from secondary cosmic radiation (e.g., high energy neutrons and/or thermal neutrons) incident on the semiconductor device. The radiation shield can include a first portion with one or more walls attached to a perimeter portion of the package substrate. Additionally, or alternatively, the radiation shield can include a second portion with one or more lids carried above the die stack (e.g., carried by the die stack, one or more spacers, the walls, and/or any other suitable structure). As the radiation shields completely absorb and/or absorb impacts from the neutrons, the radiation shields can be damaged over time. For example, as discussed in more detail below, as the radiation shields completely absorb neutrons, the relevant atoms can transition from stable isotopes to less stable isotopes and/or decay into atoms that are less capable of absorbing neutrons. In another example, as the radiation shields absorb impacts from the neutrons, the molecules therein can be excited, leading to some degradation of the materials over time.

In various embodiments, each of the first and second portions can include materials that include hydrocarbons, boron, lithium, gadolinium, cadmium, and the like (collectively referred to herein as "neutron-absorbing materials") to effectively absorb the neutrons from the neutron radiation. For example, the hydrogen atoms in a hydrocarbon material have a relatively similar size to the neutrons. As a result, a high energy neutron incident on the hydrogen atom can transfer a relatively large about of kinetic energy into the hydrogen atom (e.g., as opposed to a larger atom, which will either deflect the neutron without receiving much kinetic energy or absorb the neutron and emit further radiation based on the high amount of energy in the input). The transfer of kinetic energy converts the neutron from a high energy neutron to a thermal neutron (sometimes referred to herein as "decelerating" the high energy neutrons), which are less likely to damage the electrical components of the semiconductor device and/or can be more easily absorbed (e.g., in another neutron-absorbing material in the semiconductor device) without emitting further radiation. In some embodiments, the hydrocarbon materials used in the semiconductor device have a relatively high density of hydrogen atoms. In turn, the high density can increase the likelihood that a neutron incident on the semiconductor device will impact a hydrogen atom and thereby be decelerated.

Atoms such as boron, lithium, gadolinium, and cadmium are effective at completely absorbing the neutrons incident on the semiconductor device. For example, the two most common isotopes of boron are boron-10 and boron-11. Boron-10 can absorb neutrons to become boron-11, while boron-11 can absorb neutrons to eventually decay into a carbon atom. In both instances, the neutron absorption occurs in a stable manner, without creating a radioactive isotope and without emitting other particles that are harmful to the semiconductor device. Lithium, gadolinium, and cadmium can also absorb neutrons in a similar manner. Accordingly, in some embodiments, the semiconductor device includes one or more structures that include boron, lithium, gadolinium, and/or cadmium atoms to completely absorb the neutrons incident on the semiconductor device and/or decelerated by a hydrocarbon material.

Without wishing to be bound by theory, it is believed that the boron, lithium, gadolinium, and/or cadmium atoms are especially effective at absorbing thermal neutrons (e.g., as compared to the high energy neutrons). Accordingly, in some embodiments, the semiconductor device can include multiple components with the neutron-absorbing materials. For example, as discussed in more detail below, a hydrocarbon-rich material can cover an external surface of the semiconductor device to decelerate high energy neutrons, while one or more structures that include boron, lithium, gadolinium, and/or cadmium can surround the electrical components to absorb at least a portion of the resulting thermal neutrons and/or at least a portion of any remaining high energy neutrons.

For example, the walls of the first portion can include one or more layers of a neutron-shielding film that is doped with, impregnated with, and/or includes vias at least partially filled with the neutron-absorbing materials. In another example, the lid of the second portion can include a resin that is doped with, impregnated with, and/or includes vias at least partially filled with the neutron-absorbing materials. Accordingly, the first portion can absorb neutrons incident on the sides of the semiconductor device and/or the second portion can absorb neutrons incident on the top of the semiconductor device.

In some embodiments, the semiconductor device includes a neutron-shielding die attach film that is doped with, impregnated with, and/or partially formed from the neutron-absorbing materials. For example, in some embodiments, the die stack is attached to the package substrate through a layer of the neutron-shielding die attach film. In some embodiments, each die in the die stack is attached to the structures below it (e.g., another die, the package substrate, a spacer, etc.) through a layer of the neutron-shielding die attach film. The neutron-shielding die attach film can provide additional layers of protection to each of the dies in the die stack, for example shielding the dies from neutron radiation that makes it through the radiation shields and/or is incident on the package substrate.

In some embodiments, the semiconductor device includes a mold compound disposed over the package substrate and at least partially covers the die stack and the radiation shield. In some such embodiments, the semiconductor device also includes a hydrocarbon-based coating disposed over an exterior surface of the mold compound and/or the package substrate. The hydrocarbon-based coating can add an additional layer of protection from the neutrons that are incident on the semiconductor device. For example, the hydrocarbon-based material can absorb impacts from the neutrons to slow the speed of the neutrons, thereby converting high energy neutrons into thermal neutrons that are more easily absorbed by the radiation shield. In various embodiments, the hydrocarbon coating can include polyethylene and/or paraffin wax with a thickness between about 50 microns (μm) and about 150 μm.

As used herein, absorbing neutrons can refer to both completely absorbing the neutron into a relevant atom (e.g., the process discussed above with respect to boron-10 becoming boron-11) and absorbing impacts from the neutrons (e.g., the process of decelerating a high energy neutron).

For ease of reference, the semiconductor device and its components are sometimes described herein with reference to top and bottom, upper and lower, upwards and downwards, and/or horizontal plane, x-y plane, vertical, or z-direction relative to the spatial orientation of the embodiments shown in the figures. It is to be understood, however, that the semiconductor device and its components can be moved to, and used in, different spatial orientations without changing the structure and/or function of the disclosed embodiments of the present technology.

Further, although primarily discussed herein as in the context of a radiation shield for protecting a die stack in a semiconductor device, one of skill in the art will understand that the scope of the technology is not so limited. For example, the radiation shields disclosed herein can also be used to shield various other components of a semiconductor device and/or at alternative levels of a package containing semiconductor devices. Accordingly, the scope of the invention is not confined to any subset of embodiments, and is confined only by the limitations set out in the appended claims.

Various Embodiments of the Semiconductor Device

Figure 2A:
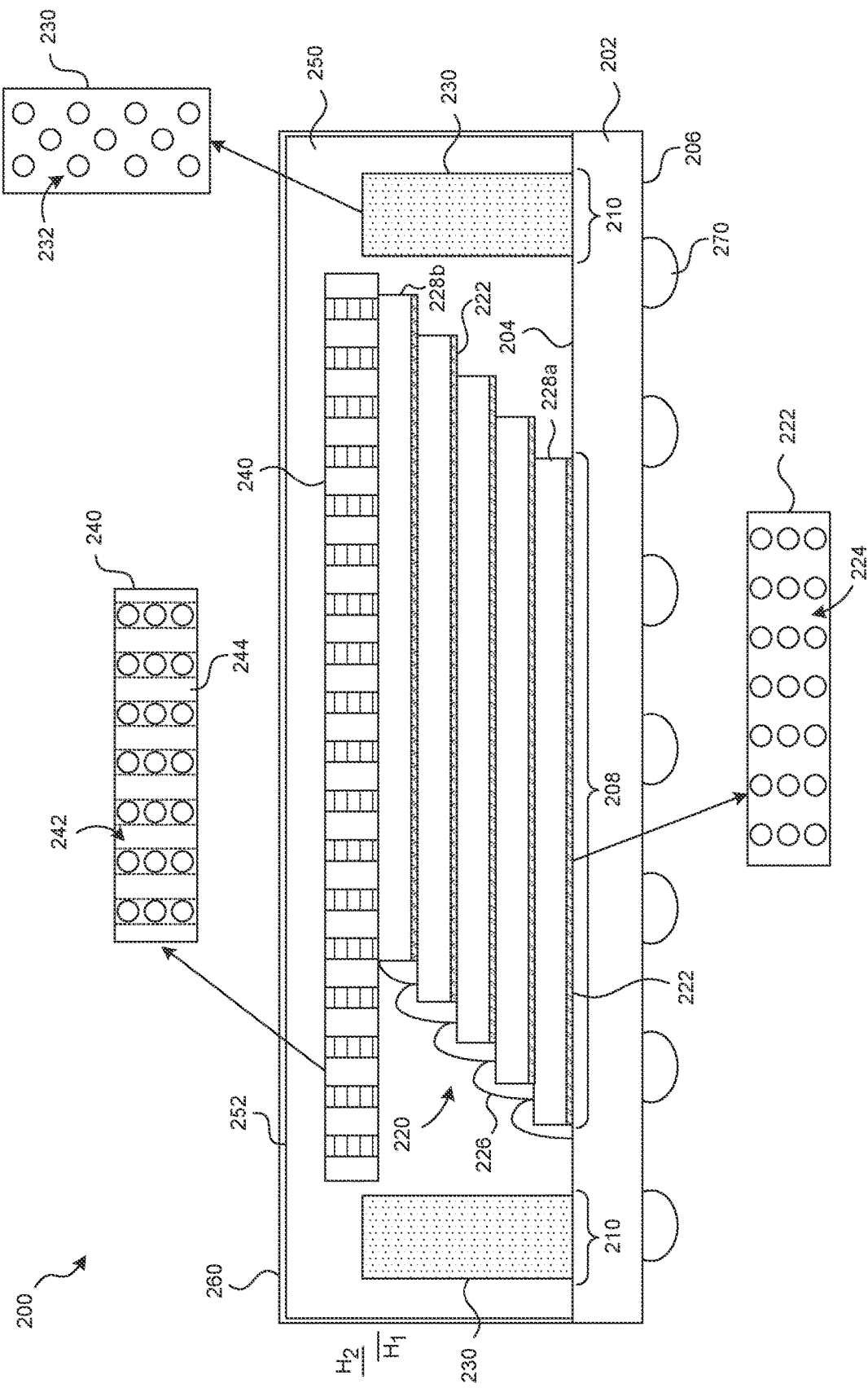
FIG. 2A is a cross-sectional view of a semiconductor device that includes radiation shields in accordance with some embodiments of the present technology.

FIG. 2A is a cross-sectional view of a semiconductor device 200 configured in accordance with some embodiments of the present technology. In the illustrated embodiment, the semiconductor device 200 includes a package substrate 202 that includes a first surface 204 (e.g., an upper surface and/or a stacking surface) and a second surface 206 (e.g., a lower surface and/or a package connection surface) opposite the first surface 204. As discussed in more detail below, the first surface 204 includes a central region 208 (also referred to as a "die attach region") and a perimeter region 210 (also referred to as a "shield attach region") that at least partially surrounds the central region 208. A stack of semiconductor dies 220 (the "die stack 220") is carried by the central region 208. Each individual die in the die stack 220 can be physically attached to the package substrate 202 and/or any die beneath the die through a die attach film 222. Further, each of the dies in the die stack 220 is electrically intercoupled through one or more wire bonds 226, while a lowermost die 228a is electrically coupled to the package substrate 202 through the wire bonds 226.

In some embodiments, each of the dies in the die stack 220 can be a memory die, a logic die, a controller die, or any other kind of die. Further, in some embodiments, the die stack 220 can include any combination of die types therein. Purely by way of example, the lowermost die 228a can be a logic die, while each of the dies above the lowermost die 228a can be memory dies. Additionally, in some embodiments, the die stack 220 can be carried by a controller die (not shown) between the die stack 220 and the package substrate 202 and independently connected to the package substrate 202 and/or any of the dies in the die stack 220.

In the illustrated embodiment, the die attach film 222 includes a plurality of regions 224 that are doped with a neutron-absorbing material, such as various hydrocarbons (e.g., various polymers such as polyethylene and polypropylene, and/or a paraffin wax), boron, lithium, gadolinium, cadmium, and the like. As a result, each layer of the die attach film 222 can absorb high energy and/or thermal neutrons, high energy and/or thermal impacts from neutrons, and/or impacts from related particles and/or rays. For example, in embodiments that include boron doped into the plurality of regions 224, each atom of boron-10 can absorb a neutron to become boron-11, while some of the boron-11 atoms can absorb a neutron to become a carbon isotope. In various embodiments, the die attach film 222 can include the neutron-absorbing material in various additional, or alternative, ways. For example, in some embodiments, the base material for the die attach film 222 can include a hydrocarbon-base molecule while the plurality of regions 224 include boron, lithium, gadolinium, and/or cadmium atoms. In such embodiments, the die attach film 222 can provide a two-part protective layer, with the hydrocarbon molecules decelerating high energy neutrons and the boron, lithium, gadolinium, and/or cadmium atoms absorbing the resulting thermal neutrons.

As further illustrated in FIG. 2A, the semiconductor device 200 also includes one or more radiation-shielding walls 230 (two shown, also referred to herein as "walls," "sacrificial walls," "neutron absorbing walls," and/or "portions of a radiation shield") carried by the perimeter region 210 of the first surface 204. The walls 230 can include the neutron-absorbing material to absorb neutrons incident on longitudinal sides of the semiconductor device 200. In the illustrated embodiment, the neutron-absorbing material is incorporated into a plurality of vias 232 in each of the walls 230. In some embodiments, the walls 230 include one or more layers of a film impregnated with, doped with, or otherwise incorporating the neutron-absorbing material. In such embodiments, the walls 230 can be built up by stacking the layers of the film in succession around the perimeter region 210 of the first surface 204.

In some embodiments, the film material also includes a neutron-absorbing material. For example, in some embodiments, the film material can include hydrocarbon molecules while the vias 232 are at least partially filled with boron, lithium, gadolinium, and/or cadmium. As a result, the walls 230 can provide a two-part protective surrounding, with the hydrocarbon molecules decelerating high energy neutrons and the boron, lithium, gadolinium, and/or cadmium absorbing the resulting thermal neutrons. In various other embodiments, the base material can be various other suitable metal based or resin-based epoxy materials.

Further, the die stack 220 has an overall first height $H_1$, while the walls 230 have a second height $H_2$. In the illustrated embodiment, the second height $H_2$ is greater than the first height $H_1$, such that the walls 230 provide a complete shield to each longitudinal side of the die stack 220 that they are adjacent to. In some embodiments, accordingly, the walls 230 can provide a complete shield to the longitudinal sides of the die stack 220 (e.g., when the perimeter region 210 completely circumscribes the central region 208, and the walls 230 fill the perimeter region 210). In various embodiments, the second height $H_2$ can be generally equal to and/or less than the first height $H_1$. Further, in some embodiments, the walls 230 can have non-uniform heights (e.g., a first wall can have a first height generally equal to the height of the die stack while a second wall has a second height greater than the height of the die stack).

In the illustrated embodiment, the semiconductor device 200 also includes a radiation-shielding lid 240 (also referred to herein as the "lid," "sacrificial lid," "neutron absorbing lid," and/or "portions of a radiation shield") carried above the die stack 220. For example, in the illustrated embodiment, the lid 240 is carried directly by an uppermost die 228b in the die stack 220. In various other embodiments, the lid 240 can be at least partially carried by the walls 230, one or more spacers (discussed in more detail with respect to FIG. 6), and/or any other suitable structure. Similar to the walls 230, the lid 240 can include the neutron-absorbing material to absorb neutrons incident on an upper surface of the semiconductor device 200. In the illustrated embodiment, the lid 240 includes a sea of vias 242 at least partially filled with a neutron-absorbing material and formed into a base material 244.

In some embodiments, the base material 244 also includes a neutron-absorbing material. For example, in some embodiments, the base material 244 can include a partially, or fully, cured resin containing hydrocarbon molecules while the sea of vias 242 is at least partially filled with boron, lithium, gadolinium, and/or cadmium. As a result, the lid 240 can provide a two-part protective cover, with the hydrocarbon molecules decelerating high energy neutrons and the boron, lithium, gadolinium, and/or cadmium absorbing the resulting thermal neutrons. In various other embodiments, the base material can be various other suitable metal based or resin-based epoxy materials.

As further illustrated in FIG. 2A, the semiconductor device 200 can also include a molding compound 250 (e.g., an encapsulant) disposed over at least a portion of the die stack 220, the walls 230, and the lid 240. In some embodiments, the molding compound 250 can be an epoxy resin that is fully cured on the semiconductor device 200. Further, in the illustrated embodiment, an additional protective layer 260 is disposed over an external surface 252 of the molding compound 250. The additional protective layer 260 can add an additional layer of protection from the neutrons that are incident on the semiconductor device 200. For example, the additional protective layer 260 can include a hydrocarbon-based material. As discussed above, the hydrogen atoms in the hydrocarbon material have a relatively similar size to the neutrons. Accordingly, the hydrogen atoms can absorb the impacts from high energy neutrons more easily than other compounds, thereby converting the high energy neutrons into thermal neutrons that are more easily completely absorbed by the neutron-absorbing materials in the die attach film 222, the walls 230, and/or the lid 240. In various embodiments, the additional protective layer 260 can include polyethylene and/or paraffin wax with a thickness between about 50 microns (μm) and about 150 μm.

Figure 2B:
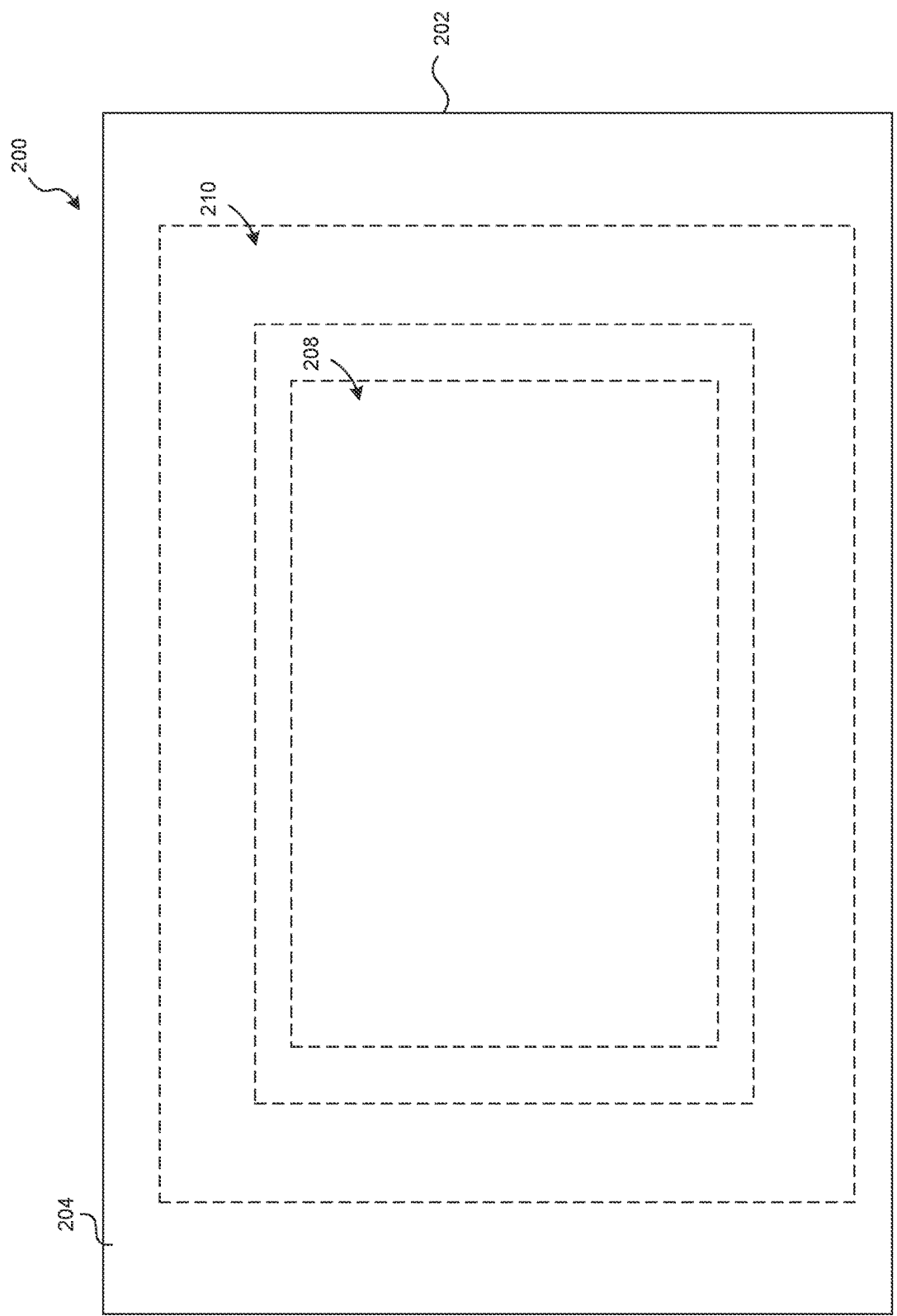
FIGS. 2B and 2C are a top plan view and a top view, respectively, of the semiconductor device 200 of FIG. 2A in accordance with some embodiments of the present technology.
Figure 2C:
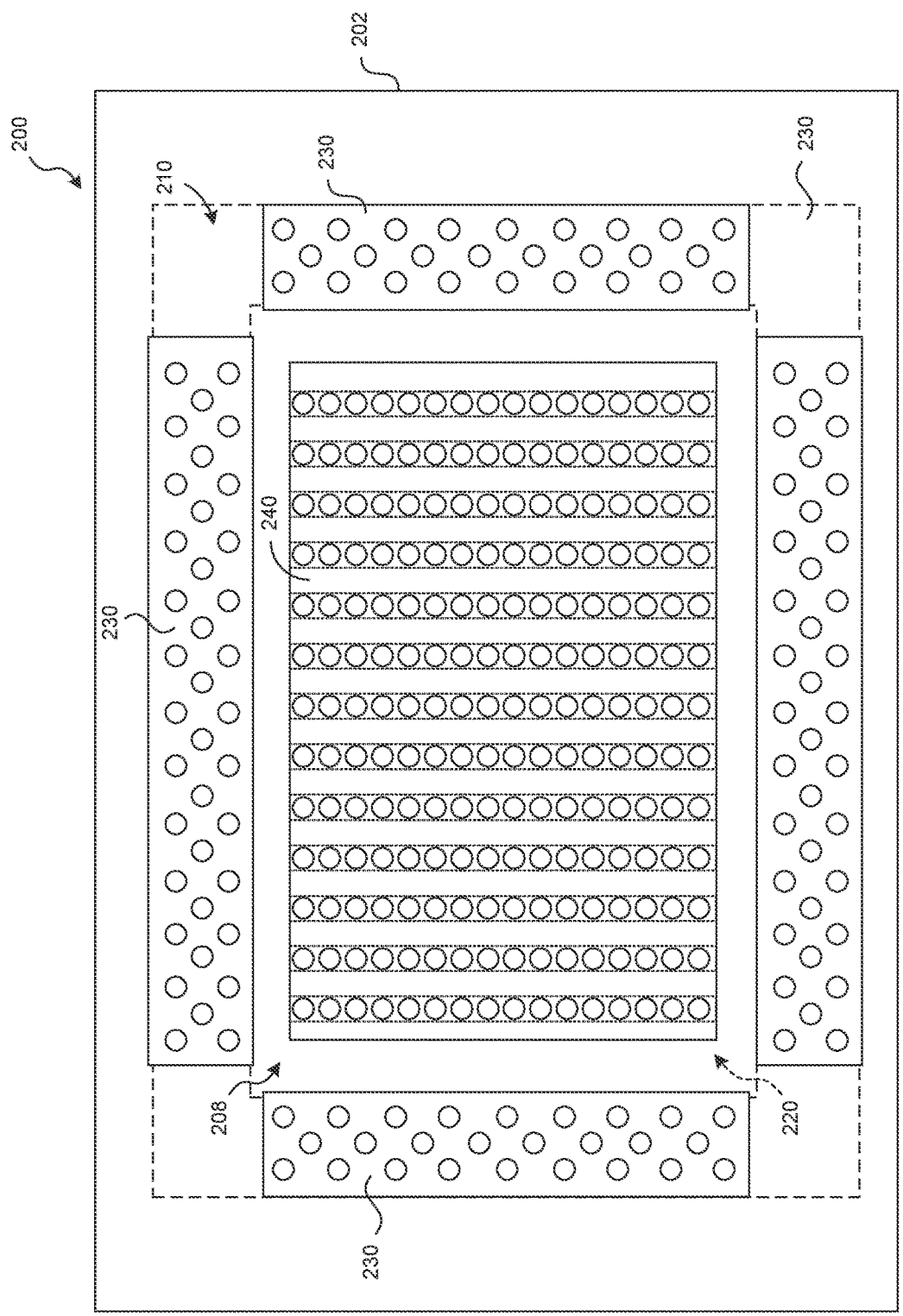

FIGS. 2B and 2C are a top plan view and a top view, respectively, of the semiconductor device 200 of FIG. 2A in accordance with some embodiments of the present technology. As illustrated in FIG. 2B, the perimeter region 210 of the first surface 204 completely circumscribes the central region 208 of the first surface 204. Accordingly, in some embodiments, the semiconductor device 200 includes walls 230 (FIG. 2A) that completely circumscribe the central region 208. In some embodiments, the semiconductor device 200 includes walls 230 that do not completely circumscribe the central region 208, and instead surround a predetermined amount of the central region 208 by filling a predetermined percentage (e.g., 50 percent, 60 percent, 70 percent, 80 percent, 90 percent, or any other suitable percent) of the perimeter region 210.

In some such embodiments, the walls 230 can be positioned on each longitudinal side of the central region 208, for example as illustrated in FIG. 2C. In some embodiments, the walls 230 can be positioned within the perimeter region 210 based at least partially according to a predetermined plan for the attachment of the semiconductor device 200 to other semiconductor devices. For example, when the semiconductor device 200 will be mounted adjacent another semiconductor device with radiation-shielding features, the corresponding longitudinal side can omit the walls 230. In such embodiments, the predetermined plan exploits the radiation-shielding features of adjacent semiconductor devices to reduce the longitudinal footprint of each of the semiconductor devices.

As further illustrated in FIG. 2C, the lid 240 can have a longitudinal footprint generally equal to, or greater than, the longitudinal footprint of the central region 208. Accordingly, the lid 240 can provide radiation-shielding protection to each die and/or any other electrical component within the central region 208 without the need for careful alignment between the lid 240 and the protected components.

Figure 3:
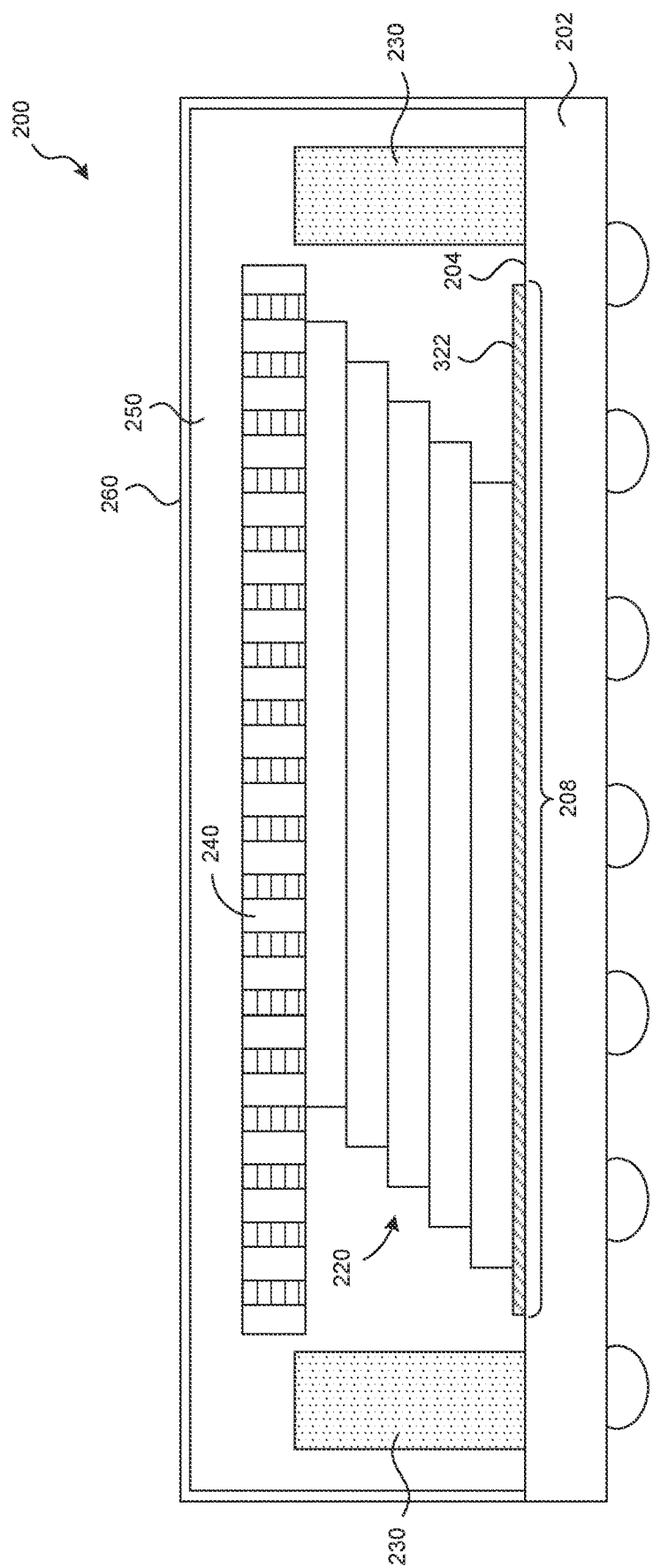
FIG. 3 is a cross-sectional view of a semiconductor device of the type shown in FIG. 2A with radiation shields configured in accordance with further embodiments of the present technology.

FIG. 3 is a cross-sectional view of a semiconductor device 200 of the type shown in FIG. 2A in accordance with some embodiments of the present technology. As illustrated in FIG. 3, the semiconductor device 200 includes the package substrate 202, the die stack 220 and the walls 230 carried by the package substrate 202, the lid 240 carried above the die stack 220, the molding compound 250, and the additional protective layer 260. As illustrated in FIG. 3, the semiconductor device 200 can also include one or more layers of a die attach film 322 between a lowermost die 320a in the die stack 220 and the package substrate 202. In the illustrated embodiment, the die attach film 322 has a longitudinal footprint that is larger than the longitudinal footprint of the die stack 220 taken as a whole. Further, similar to the die attach film 222 discussed above, the die attach film 322 can include a neutron-absorbing material. Accordingly, the die attach film 322 can provide a radiation shield beneath the entire die stack 220.

In some embodiments, a relatively thin radiation shield (e.g., as compared to the lid 240 and the walls 230) is all that is necessary beneath the die stack 220. For example, when the semiconductor device 200 will be mounted to a printed circuit board opposite another semiconductor device with radiation shielding materials (e.g., on opposite sides of a DRAM), the semiconductor device 200 can rely on the radiation shielding materials in the opposing semiconductor device (and vice versa). Accordingly, in some such embodiments, the overall height of the semiconductor device 200 can be reduced through the inclusion of a relatively thin die attach film 322. Further, reducing the number of the die attach films 222, 322 that include the neutron-absorbing material can help reduce the cost of each individual semiconductor device. In some embodiments, the die attach films 222, 322 that include the neutron-absorbing material can be omitted altogether, thereby relying on the radiation shields in opposing semiconductor devices.

Figure 4:
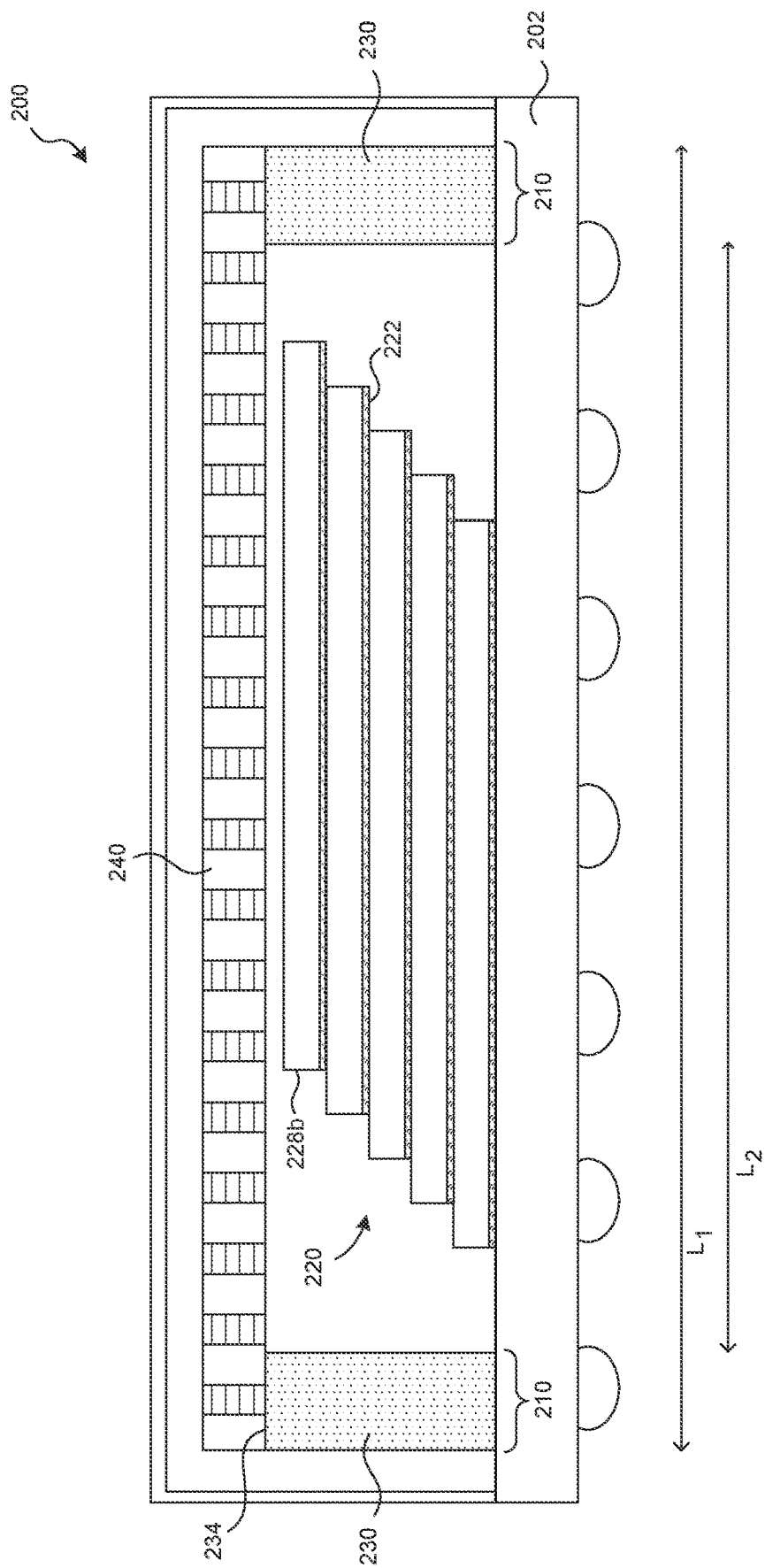
FIG. 4 is a cross-sectional view of a semiconductor device with radiation shields configured in accordance with further embodiments of the present technology.

FIG. 4 is a cross-sectional view of a semiconductor device 200 of the type shown in FIG. 2A in accordance with further embodiments of the present technology. As illustrated in FIG. 4, the semiconductor device 200 includes the package substrate 202, the die stack 220 and the walls 230 carried by the package substrate 202, the lid 240 carried above the die stack 220, the molding compound 250, and the additional protective layer 260. In the illustrated embodiment, however, the lid 240 is carried by an upper surface 234 of the walls 230. To be carried by the walls 230, the lid 240 can have at least one longitudinal side length $L_1$ (e.g., length or width) that is equal to, or greater than, a corresponding length $L_2$ between longitudinal sides of the perimeter region 210. In some embodiments, the lid 240 is carried by an upper surface 234 of the walls 230 on each longitudinal side of the perimeter region 210, thereby completely covering the area circumscribed by the perimeter region 210. In some such embodiments, the walls 230 can also completely circumscribe the perimeter region 210, thereby completely encasing the longitudinal sides and upper surface of the semiconductor device 200 in the radiation-shielding materials.

As further illustrated in FIG. 4, because the walls 230 have a taller height than the die stack 220, a space can be provided above the uppermost die in the die stack 220. The space can help facilitate the electrical connection of the uppermost die 228b to the remaining dies in the die stack 220. For example, in some embodiments, the space allows the uppermost die 228b to be more easily wire bonded to electrically couple the uppermost die to the remaining dies.

Figure 5:
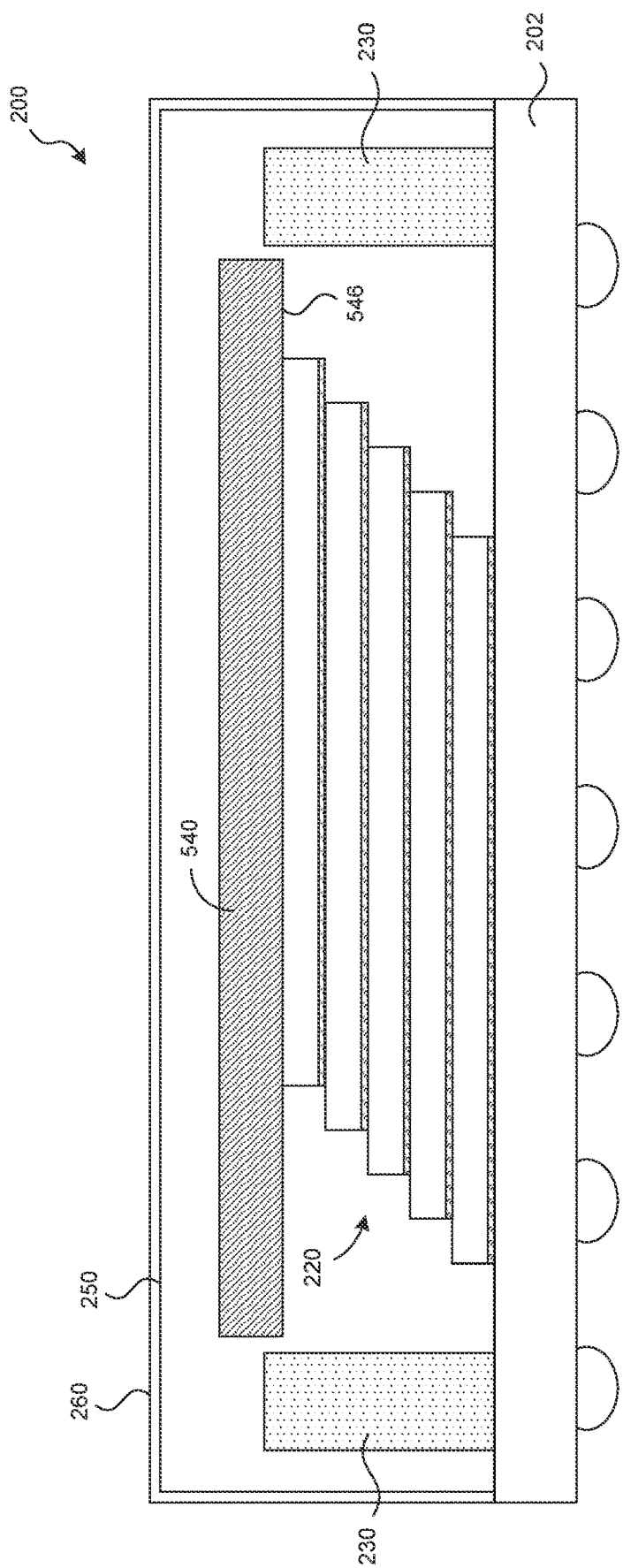
FIG. 5 is a cross-sectional view of a semiconductor device with radiation shields configured in accordance with further embodiments of the present technology.

FIG. 5 is a cross-sectional view of a semiconductor device 200 of the type shown in FIG. 2A in accordance with further embodiments of the present technology. As illustrated in FIG. 5, the semiconductor device 200 includes the package substrate 202, the die stack 220 and the walls 230 carried by the package substrate 202, the molding compound 250, and the additional protective layer 260. In the illustrated embodiment, the semiconductor device 200 includes an alternative lid 540 carried by the uppermost die in the die stack 220. The alternative lid 540 can be a liquid-based polymer that includes a neutron-absorbing material suspended and/or otherwise incorporated therein. For example, in some embodiments, the alternative lid 540 is a liquid-based polyethylene that is comprised of hydrocarbon molecules. As discussed above, the hydrocarbon molecules can absorb impacts from neutrons incident on the semiconductor device 200, thereby converting high energy neutrons into thermal neutrons before they are incident on the die stack 220. The thermal neutrons are expected to cause less damage within the semiconductor device 200. Further, at least a portion of the thermal neutrons can be captured by the die attach film 222 within the die stack 220.

Figure 6:
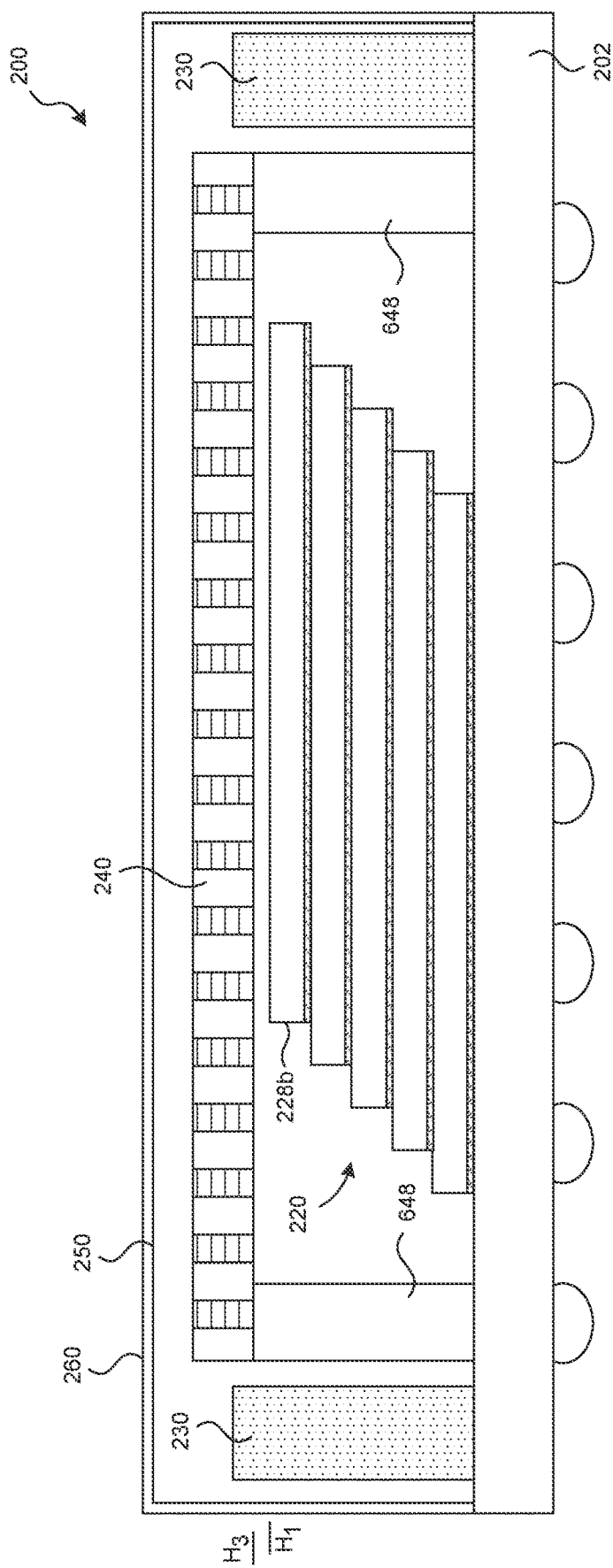
FIG. 6 is a cross-sectional view of a semiconductor device with radiation shields configured in accordance with further embodiments of the present technology.

FIG. 6 is a cross-sectional view of a semiconductor device 200 of the type shown in FIG. 2A in accordance with further embodiments of the present technology. As illustrated in FIG. 6, the semiconductor device 200 includes the package substrate 202, the die stack 220 and the walls 230 carried by the package substrate 202, the lid 240 carried above the die stack 220, the molding compound 250, and the additional protective layer 260. In the illustrated embodiment, however, the lid 240 is carried by one or more spacers 648 (two shown) that are in turn carried by the package substrate 202 between the die stack 220 and the walls 230. In various embodiments, the spacers 648 can be a silicon material, an organic material (e.g., a prepreg substrate such as a partially cured epoxy), copper, and/or any other suitable material; can include the neutron-shielding material (e.g., can be doped with the neutron-shielding material), thereby further protecting the die stack 220; and/or can include any other suitable materials (e.g., thermally conductive materials).

As illustrated in FIG. 6, each of the spacers 648 has a third height $H_3$ that is equal to or greater than the first height $H_1$ of the die stack 220. Accordingly, similar to the embodiments discussed above with respect to FIG. 4, the semiconductor device 200 includes the space above the uppermost die in the die stack 220. As discussed above, the space can help facilitate the electrical connection of the uppermost die 228b to the remaining dies in the die stack 220. For example, in some embodiments, the space allows the uppermost die 228b to be more easily wire bonded to electrically couple the uppermost die to the remaining dies.

Figure 7:
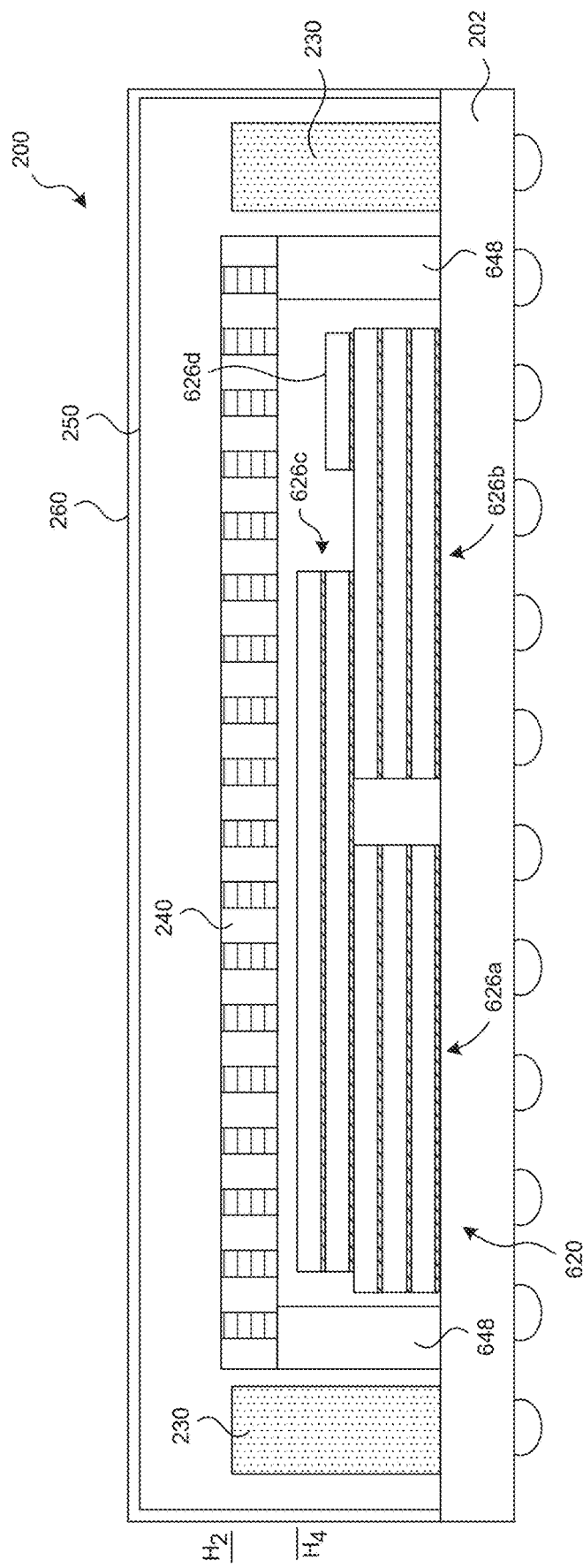
FIG. 7 is a cross-sectional view of another semiconductor device in accordance with some embodiments of the present technology.

FIG. 7 is a cross-sectional view of a semiconductor device 300 in accordance with some embodiments of the present technology. Similar to the semiconductor device 200 discussed above, with respect to FIG. 6, the semiconductor device 300 includes the package substrate 202, the walls 230 carried by the package substrate 202, the lid 240 carried by the spacers 648, the molding compound 250, and the additional protective layer 260. In the illustrated embodiment, the semiconductor device 300 also includes a die stack 620 that includes multiple sub-stacks 626 of dies (four shown, referred to individually as first-fourth sub-stacks 626a-626d). Like the die stack 220 discussed above with respect to FIG. 2, the die stack 620 is carried by the central region 208 of the first surface 204 of the package substrate 202. Accordingly, each die in the die stack 620 is positioned within the longitudinal footprint of the lid 240 and is thereby at least partially shielded from neutrons incident on the semiconductor device 200 by the lid 240. Further, the die stack 620 has an overall fourth height $H_4$ that is beneath the second height $H_2$ of the walls 230. As a result, each die in the die stack 620 is at least partially shielded from neutrons incident on the semiconductor device 200 by the walls 230.

As further illustrated in FIG. 7, the first-fourth sub-stacks 626a-626d can have varying numbers and sizes of dies. For example, the first and second sub-stacks 626a, 626b each include three first dies (e.g., memory dies); the third sub-stack 626c includes two second dies (e.g., logic dies); and the fourth sub-stack 626d includes one fourth die 626d (e.g., a controller die). In various embodiments, the first-fourth sub-stacks 626a-626d can include any other suitable combination and number of dies. For example, the first sub-stack 626a can include one, two, four, or any other suitable number of dies that includes any combination of memory, logic, controller, and/or any other suitable die. In the illustrated embodiment, the first and second sub-stacks 626a, 626b are both carried directly by the package substrate 102, the third sub-stack 626c is carried at least partially by each of the first and second sub-stacks 626a, 626b, and the fourth sub-stack 626d is carried by the second sub-stack. In various embodiments, the arrangement between the first-fourth sub-stacks 626a-626d can be modified in any suitable way. For example, the fourth sub-stack 626d can be carried by the third sub-stack 626c above the first and second sub-stacks 626a, 626b.

Further, in some embodiments, the die stack 620 in the semiconductor device 200 can include any other suitable number of sub-stacks of dies arranged in any other suitable manner. For example, the die stack 620 can include two, three, five, ten, and/or any other suitable number of sub-stacks. In some embodiments, two or more of the sub-stacks can be stacked on top of each other with the dies in each sub-stack staggered in different directions, thereby allowing a series of wire bond connections to independently couple each sub-stack to the package substrate 202.

Figure 8:
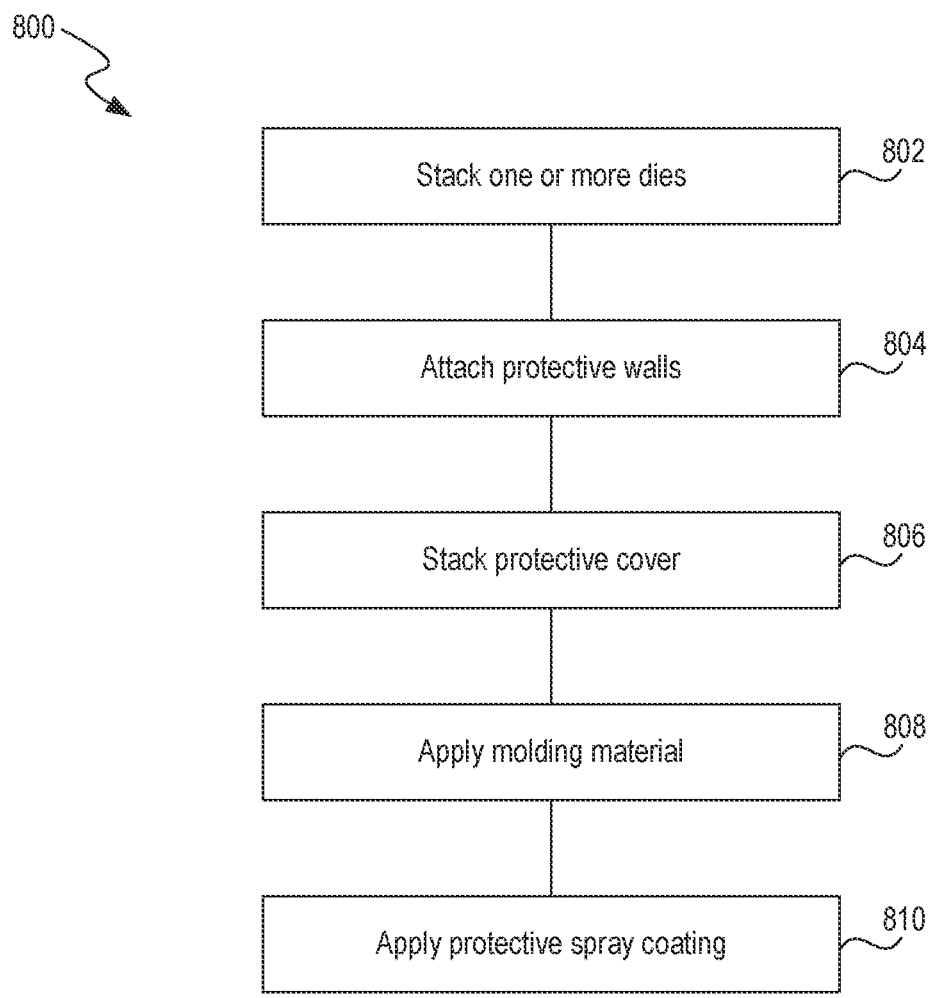
FIG. 8 is a flow diagram of a process for manufacturing a semiconductor device of the type shown in FIGS. 2A-7 in accordance with some embodiments of the present technology.

FIG. 8 is a flow diagram of a process 800 for manufacturing a semiconductor device of the type shown in FIGS. 2A-7 in accordance with some embodiments of the present technology. In the illustrated embodiment, the process 800 begins at block 802 with stacking one or more first dies on a central portion of a package substrate. The one or more first dies can include a portion of a die stack, the entirety of the die stack, one or more sub-stacks of the die stack, and/or one or more portions of one or more of the sub-stacks.

At block 804, the process 800 includes attaching one or more radiation-shielding walls to the package substrate. As discussed above, the radiation-shielding walls can be attached to a perimeter portion of the package substrate. In some embodiments, the radiation-shielding walls can at least partially surround and/or circumscribe the one or more dies stacked at block 802 and/or the central portion of the package substrate. In some embodiments, the process 800 can execute block 804 before executing block 802 to attach the radiation-shielding walls before stacking any dies on the package substrate. In some embodiments, the process 800 can return to block 802 after block 804 to stack one or more additional dies after attaching the one or more radiation-shielding walls. In some such embodiments, the process 800 can then return to block 804 to attach one or more additional radiation-shielding walls to the package substrate.

At block 806, the process 800 includes stacking a radiation-shielding lid over the one or more dies stacked at block 802. As discussed above, the radiation-shielding lid can be at least partially carried by the one or more dies, the one or more radiation-shielding walls, and/or one or more spacers on the package substrate. In some embodiments, the process 800 can execute block 806 before executing block 804 to stack the radiation-shielding lid over the one or more dies before attaching the radiation-shielding walls to the package substrate. In some embodiments, the process 800 can return to block 804 after block 806 to attach one or more additional radiation-shielding walls to the package substrate.

At block 808, the process 800 includes applying a molding compound over the components of the semiconductor device. The molding compound can at least partially cover each of the one or more dies, the one or more radiation-shielding walls, the one or more spacers, and/or the radiation-shielding lid. In some embodiments, applying the molding compound over the components of the semiconductor device includes flowing an encapsulant over the components, then fully (or partially) curing the encapsulant.

At block 810, the process 800 includes applying an additional protection layer to an exterior surface of the molding compound. The additional protection layer can include a neutron-absorbing material, such as a hydrocarbon-rich polymer. In some embodiments, applying the additional protection layer includes a spray coating process and/or a curing process to solidify the additional protection layer. In various embodiments, the additional protection layer can have a thickness between about 50 µm and about 150 µm after being fully applied.

As discussed above, one or more of the blocks 802-806 can be performed in another order than illustrated. For example, as discussed above, the process 800 can execute block 804 after block 806 to attach the radiation-shielding walls to the package substrate after stacking the protective cover; can execute block 802 after block 804 to stack one or more dies after attaching the radiation-shielding walls to the package substrate; etc.

Further, in some embodiments, the process 800 can altogether omit some of the blocks discussed above. For example, for a semiconductor device that will be attached in the middle of an array of other semiconductor devices with radiation-shielding walls, the process 800 can omit block 804. In such embodiments, the process 800 can rely on the radiation-shielding walls in other semiconductor devices for protection and reduce the overall longitudinal footprint of the subject semiconductor device.

In some embodiments, the process 800 can omit one or more of the blocks discussed above altogether. For example, in some embodiments, the process 800 can omit block 804, for example when the semiconductor device will be fully surrounded by other semiconductor devices; omit block 806, for example when the semiconductor device will be stacked underneath other semiconductor devices; omit block 810, for example when the radiation-shielding lid and walls offer sufficient protection; etc.

Figure 9:
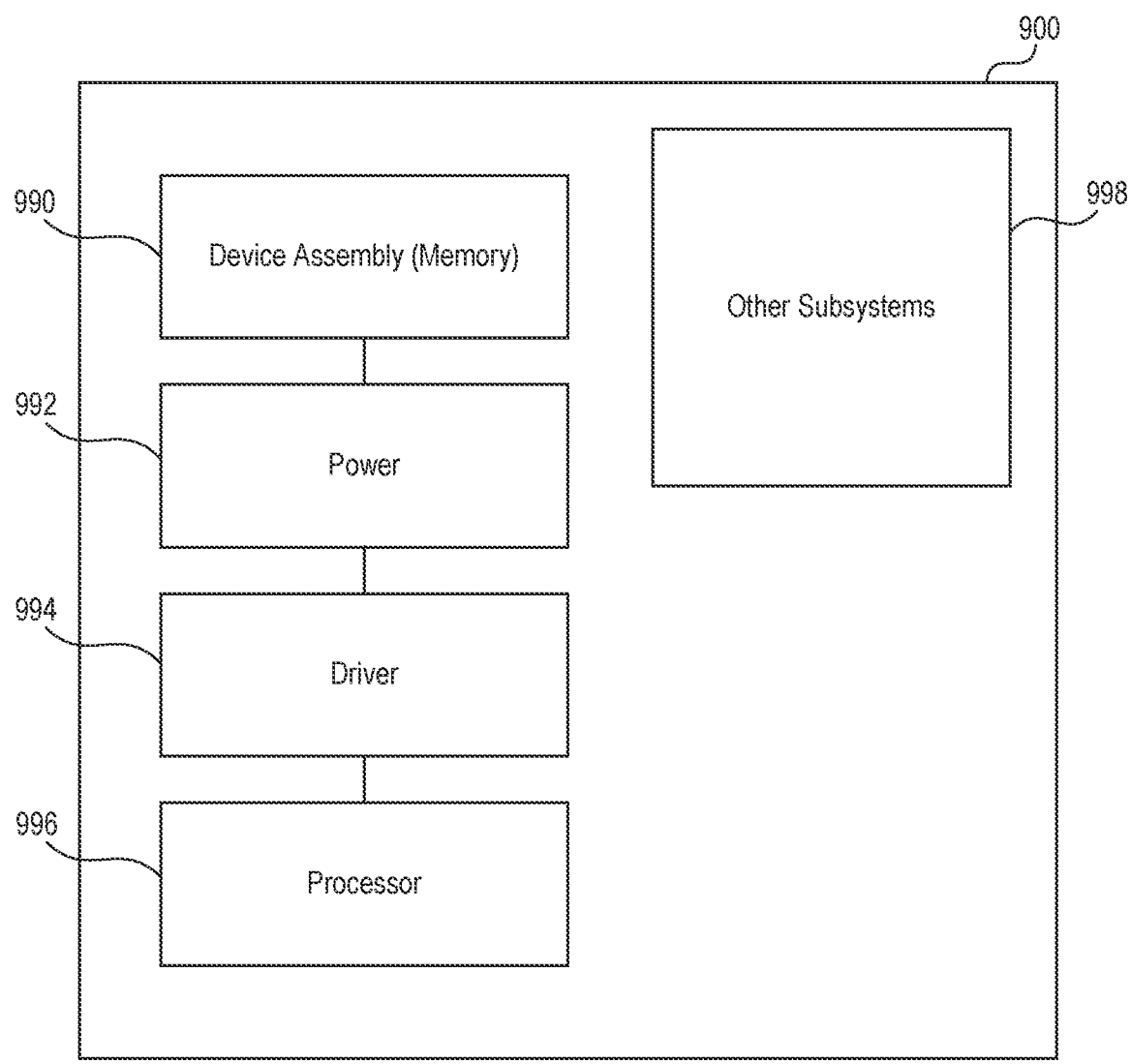
FIG. 9 is a schematic view of a system that includes a semiconductor die assembly configured in accordance with embodiments of the present technology.

FIG. 9 is a schematic view of a system 900 that includes a semiconductor die assembly configured in accordance with embodiments of the present technology. Any one of the semiconductor devices having the features and/or resulting from the processes described above with reference to FIGS. 1A-7 can be incorporated into any of a myriad of larger and/or more complex systems, a representative example of which is system 900 shown schematically in FIG. 9. The system 900 can include a memory 990 (e.g., SRAM, DRAM, flash, and/or other memory devices), a power supply 992, a drive 994, a processor 996, and/or other subsystems or components 998. Semiconductor devices like those described above with reference to FIGS. 1-7 (or resulting from the processes described above with respect to FIG. 8), can be included in any of the elements shown in FIG. 9. For example, the memory 990 can include a stacked semiconductor device with radiation-shielding components such as those discussed above with respect to FIG. 2A. The resulting system 900 can be configured to perform any of a wide variety of suitable computing, processing, storage, sensing, imaging, and/or other functions. Accordingly, representative examples of the system 900 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 900 include lights, cameras, vehicles, etc. With regard to these and other example, the system 900 can be housed in a single unit or distributed over multiple interconnected units, e.g., through a communication network. The components of the system 900 can accordingly include local and/or remote memory storage devices and any of a wide variety of suitable computer-readable media.

CONCLUSION

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same features and/or additional types of other features are not precluded.

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A semiconductor device, comprising:
   a package substrate;
   a stack of dies carried by a central portion of the package substrate;
   one or more radiation-shielding walls attached to a perimeter portion of the package substrate, the one or more radiation-shielding walls at least partially surrounding the stack of dies, wherein the one or more radiation-shielding walls are configured to absorb neutrons from neutron radiation incident on the semiconductor device; and
   a radiation-shielding lid carried over the stack of dies, wherein the radiation-shielding lid includes a resin having a plurality of vias formed in the resin and configured to absorb neutrons from the neutron radiation incident on the semiconductor device, and wherein each of the plurality of vias is at least partially filled with one or more of a hydrocarbon material, boron, lithium, gadolinium, and cadmium.

2. The semiconductor device of claim 1 wherein the radiation-shielding lid includes a hydrocarbon material, and wherein the semiconductor device further comprises a neutron-shielding die attach film carried by an uppermost die in the stack of dies.

3. The semiconductor device of claim 1 wherein each of the one or more radiation-shielding walls includes one or more layers of a neutron-shielding film, the neutron-shielding film including a material having one or more of hydrocarbon, boron, lithium, gadolinium, and cadmium.

4. The semiconductor device of claim 1 further comprising at least one layer of neutron-shielding die attach film attaching the stack of dies to the central portion of the package substrate, wherein the neutron-shielding die attach film is impregnated with one or more of a hydrocarbon material, boron, lithium, gadolinium, and cadmium.

5. The semiconductor device of claim 1 wherein each individual die in the stack of dies includes a layer of neutron-shielding die attach film on a lower surface of each individual die, and wherein the neutron-shielding die attach film is impregnated with one or more of hydrocarbon, boron, lithium, gadolinium, and cadmium.

6. The semiconductor device of claim 1 further comprising:
   a mold compound covering the stack of dies, the one or more radiation-shielding walls, and the radiation-shielding lid, the mold compound having an exterior surface; and
   a hydrocarbon material disposed on the exterior surface of the mold compound.

7. The semiconductor device of claim 6 wherein the hydrocarbon material is an at least partially cured liquid-based polyethylene coating.

8. The semiconductor device of claim 6 wherein the hydrocarbon material is between 50 microns and 150 microns thick.

9. A semiconductor device, comprising:
   a package substrate having an upper surface with a die attach region and a perimeter region surrounding the die attach region;
   one or more semiconductor dies attached to the die attach region;
   a radiation shield carried by the package substrate, the radiation shield including:
      a first portion attached to the perimeter region at least partially surrounding the one or more semiconductor dies; and
      a second portion carried above the one or more semiconductor dies,
      wherein each of the first and second portions of the radiation shield are configured to absorb neutrons from one or more of high energy neutrons and thermal neutrons;
   a mold compound at least partially covering the one or more semiconductor dies and the first and second portions of the radiation shield, the mold compound having an outer surface; and
   a hydrocarbon coating disposed on the outer surface of the mold compound.

10. The semiconductor device of claim 9 wherein an uppermost surface of the one or more semiconductor dies is at a first height above the upper surface of the package substrate, wherein the first portion of the radiation shield includes one or more pillars attached to the perimeter region, and wherein each of the one or more pillars has a top surface at a second height greater than the first height.

11. The semiconductor device of claim 9 wherein the first portion completely surrounds longitudinal sides of the one or more semiconductor dies.

12. The semiconductor device of claim 9 wherein the one or more semiconductor dies are stacked in a semiconductor die stack having a first longitudinal footprint, wherein the second portion of the radiation shield has a second longitudinal footprint, and wherein the first longitudinal footprint is contained completely within the second longitudinal footprint.

13. The semiconductor device of claim 9 wherein each of the first and second portions of the radiation shield include one or more of a hydrocarbon material, boron, lithium, gadolinium, and cadmium.

14. The semiconductor device of claim 9 wherein each of the one or more semiconductor dies is attached to the die attach region by a neutron-shielding die attach film, and wherein the neutron-shielding die attach film includes one or more of a hydrocarbon material, boron, lithium, gadolinium, and cadmium.

15. A semiconductor device, comprising:
a base substrate;
a stack of semiconductor dies carried by the base substrate; and
a radiation-shielding lid carried over the stack of semiconductor dies and configured to absorb neutrons from neutron radiation that is incident on the semiconductor device, wherein the radiation-shielding lid comprises a resin and a plurality of vias formed in the resin, and wherein each of the plurality of vias is at least partially filled with one or more of a hydrocarbon material, boron, lithium, gadolinium, and cadmium, and wherein the plurality of vias.

16. The semiconductor device of claim 15, further comprising radiation-shielding walls attached to the base substrate at least partially surrounding the stack of semiconductor dies, wherein the radiation-shielding walls are configured to absorb neutrons from neutron radiation incident on the semiconductor device.

17. The semiconductor device of claim 16 wherein each of the radiation-shielding walls includes a plurality of stacked layers of a neutron-shielding film.

18. The semiconductor device of claim 15 wherein the stack of semiconductor dies is attached to the base substrate via a neutron-shielding die attach film, wherein the neutron-shielding die attach film is impregnated with one or more of a hydrocarbon material, boron, lithium, gadolinium, and cadmium.

* * * * *